United States Patent
Qi et al.

(10) Patent No.: US 11,380,868 B2
(45) Date of Patent: Jul. 5, 2022

(54) METHOD OF FABRICATING DISPLAY PANEL, AND DISPLAY PANEL INCLUDING ADHESIVE PORTIONS HAVING VARYING STRENGTHS

(71) Applicants: Chengdu BOE Optoelectronics Technology Co., Ltd., Sichuan (CN); BOE Technology Group Co., Ltd., Beijing (CN)

(72) Inventors: Fei Qi, Beijing (CN); Hao Yan, Beijing (CN); Zhiliang Jiang, Beijing (CN); Mingfang Wang, Beijing (CN); Yu Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 253 days.

(21) Appl. No.: 16/626,561

(22) PCT Filed: Jun. 26, 2019

(86) PCT No.: PCT/CN2019/093012
§ 371 (c)(1),
(2) Date: Dec. 25, 2019

(87) PCT Pub. No.: WO2020/119073
PCT Pub. Date: Jun. 18, 2020

(65) Prior Publication Data
US 2021/0408455 A1     Dec. 30, 2021

(30) Foreign Application Priority Data
Dec. 14, 2018   (CN) .......................... 201811531269.7

(51) Int. Cl.
*H01L 27/32*     (2006.01)
*H01L 51/00*     (2006.01)
(Continued)

(52) U.S. Cl.
CPC ...... *H01L 51/5253* (2013.01); *H01L 51/0097* (2013.01); *H01L 51/529* (2013.01);
(Continued)

(58) Field of Classification Search
CPC ............. H01L 51/5253; H01L 51/0097; H01L 51/5246; H01L 51/529; H01L 51/56;
(Continued)

(56) References Cited

U.S. PATENT DOCUMENTS 10,212,811 B1*   2/2019   Zhang ................. H01L 51/0097
10,642,313 B1*   5/2020   Wu ..................... G06V 40/1306
(Continued)

FOREIGN PATENT DOCUMENTS

CN      106653777 A     5/2017
CN      107403882 A     11/2017
(Continued)

OTHER PUBLICATIONS

International Search Report & Written Opinion dated Oct. 8, 2019, regarding PCT/CN2019/093012.
(Continued)

*Primary Examiner* — Ida M Soward
(74) *Attorney, Agent, or Firm* — Intellectual Valley Law, P.C.

(57) ABSTRACT

A method of fabricating a display panel is provided. The method includes providing a substrate including a plurality of light emitting elements; forming a first protective layer on a side of the substrate; treating the first protective layer to obtain a first adhesive portion, a second adhesive portion, and a third adhesive portion, the third adhesive portion
(Continued)

having an adhesive strength smaller than an adhesive strength of the first adhesive portion, and smaller than an adhesive strength of the second adhesive portion; and removing the third adhesive portion from the substrate to form a bendable portion of the substrate. The bendable portion of the substrate spaces apart a first portion of the substrate from a second portion of the substrate.

20 Claims, 6 Drawing Sheets

(51) Int. Cl.
```
H01L 51/52      (2006.01)
H01L 51/56      (2006.01)
G02F 1/133      (2006.01)
G09F 9/30       (2006.01)
G09G 3/04       (2006.01)
G09G 3/3283     (2016.01)
G09G 3/3291     (2016.01)
G02F 1/1333     (2006.01)
```
(52) U.S. Cl.
CPC .......... *H01L 51/5246* (2013.01); *H01L 51/56* (2013.01); *G02F 1/133305* (2013.01); *G09F 9/301* (2013.01); *G09G 3/3283* (2013.01); *G09G 3/3291* (2013.01); *G09G 2330/04* (2013.01); *G09G 2330/045* (2013.01); *H01L 27/3272* (2013.01); *H01L 2251/5338* (2013.01)

(58) Field of Classification Search
CPC ......... H01L 51/5237; H01L 2251/5338; H01L 27/3244; H01L 27/3272; G02F 1/133305; G09F 9/301; G09G 3/3283; G09G 3/3291; G09G 2330/04; G09G 2330/045
See application file for complete search history.

(56) References Cited

U.S. PATENT DOCUMENTS

| | | | | |
|---|---|---|---|---|
| 10,658,436 | B2* | 5/2020 | Shin | G09F 9/301 |
| 11,169,403 | B2* | 11/2021 | Li | G02F 1/133305 |
| 2014/0217382 | A1* | 8/2014 | Kwon | H01L 51/5246 257/40 |
| 2016/0147361 | A1* | 5/2016 | Ahn | G06F 3/041 345/173 |
| 2017/0358772 | A1* | 12/2017 | Sung | H01L 51/0097 |
| 2017/0373121 | A1* | 12/2017 | Leng | H01L 51/5253 |
| 2018/0047938 | A1* | 2/2018 | Kishimoto | H01L 51/0097 |
| 2018/0151644 | A1* | 5/2018 | Han | H01L 51/524 |
| 2018/0247992 | A1* | 8/2018 | Cho | H01L 27/3276 |
| 2018/0315804 | A1 | 11/2018 | Li et al. | |
| 2019/0006615 | A1* | 1/2019 | Jung | H01L 51/5246 |
| 2019/0081274 | A1* | 3/2019 | Choi | H01L 51/5253 |
| 2019/0181388 | A1* | 6/2019 | Kim | G09F 9/301 |
| 2019/0326529 | A1* | 10/2019 | Xie | H01L 27/3244 |
| 2020/0028123 | A1 | 1/2020 | Xie et al. | |

FOREIGN PATENT DOCUMENTS

| | | |
|---|---|---|
| CN | 107425142 A | 12/2017 |
| CN | 108538762 A | 9/2018 |
| CN | 108986664 A | 12/2018 |
| CN | 109148530 A | 1/2019 |

OTHER PUBLICATIONS

First Office Action in the Chinese Patent Application No. 201811531269. 7, dated Oct. 8, 2019; English translation attached.

* cited by examiner

METHOD OF FABRICATING DISPLAY PANEL, AND DISPLAY PANEL INCLUDING ADHESIVE PORTIONS HAVING VARYING STRENGTHS

CROSS-REFERENCE TO RELATED APPLICATION

This application is a national stage application under 35 U.S.C. § 371 of International Application No. PCT/CN2019/093012, filed Jun. 26, 2019, which claims priority to Chinese Patent Application No. 201811531269.7, filed Dec. 14, 2018. Each of the forgoing applications is herein incorporated by reference in its entirety for all purposes.

TECHNICAL FIELD

The present invention relates to display technology, more particularly, to a method of fabricating a display panel, a display panel, and a display apparatus.

BACKGROUND

In order to fabricate an Organic Light-Emitting Diode (OLED) display panel having a narrow frame, a method of Chip on Pi (COP) is used to encapsulate the display panel. Using the method of COP, a bendable portion of a display substrate in the display panel can be bent, so that a bonding area of the display substrate is hidden on the back of the display area of the display substrate. By bending the display substrate and hiding the bonding area of the display substrate on the back of the display area of the display substrate, the frame of the display panel used to accommodate the bonding area of the display substrate are unnecessary, therefore, the frame of the display panel can be narrower.

SUMMARY

In one aspect, the present invention provides a method of fabricating a display panel, comprising providing a substrate comprising a plurality of light emitting elements; forming a first protective layer on a side of the substrate; treating the first protective layer to obtain a first adhesive portion, a second adhesive portion, and a third adhesive portion, the third adhesive portion having an adhesive strength smaller than an adhesive strength of the first adhesive portion, and smaller than an adhesive strength of the second adhesive portion; and removing the third adhesive portion from the substrate, thereby forming a bendable portion of the substrate; wherein the bendable portion of the substrate spaces apart a first portion of the substrate from a second portion of the substrate.

Optionally, treating the first protective layer comprises exposing a first portion of the first protective layer with ultraviolet light, thereby forming the first adhesive portion; and exposing a second portion of the first protective layer with the ultraviolet light, thereby forming the second adhesive portion; wherein a third portion of the first protective layer is substantially unexposed by the ultraviolet light, thereby forming the third adhesive portion.

Optionally, treating the first protective layer comprises exposing the first protective layer with the ultraviolet light using a mask plate having a first light transmitting portion corresponding to the first adhesive portion, a second light transmitting portion corresponding to the second adhesive portion, and a light blocking portion corresponding to the third adhesive portion.

Optionally, a first width of the third adhesive portion on an edge of the substrate substantially along a width direction from the first adhesive portion to the second adhesive portion is greater than a second width of a center part of the third adhesive portion substantially along the width direction.

Optionally, the adhesive strength of the third adhesive portion of the first protective layer is in a range of 50 gf/inch to 150 gf/inch; and adhesive strengths of the first adhesive portion and the second adhesive portion are in a range of 1000 gf/inch to 1500 gf/inch.

Optionally, the first protective layer comprises a matrix material and an initiator.

Optionally, the matrix material is selected from a group consisting of acrylic, epoxy, and polyurethane; and the initiator is selected from a group consisting of azobisisobutyronitrile, benzophenone, fluorescein, and eosin.

Optionally, prior to removing the third adhesive portion, the method further comprises cutting the first protective layer along an interface between the first adhesive portion and the third adhesive portion, and along an interface between the second adhesive portion and the third adhesive portion.

Optionally, the first portion of the substrate comprises a display area configured to display images using the plurality of light emitting elements; the second portion of the substrate comprises a bonding area configured to bond an integrate driving circuit and to transmit driving signals sent from the integrate driving circuit to the display area; and wherein subsequent to remove the third adhesive portion of the first protective layer, the method further comprises bending the bendable portion of the substrate to allow the second adhesive portion and a part of the first adhesive portion sandwiched between the second portion of the substrate and a part of the first portion of the substrate.

Optionally, prior to treating the first protective layer, the method further comprises forming a second protective layer on a side of the substrate away from the first protective layer; subsequent to cutting the first protective layer and prior to removing the third adhesive portion of the first protective layer, further comprising removing a portion of the second protective layer to expose a surface of the bendable portion of the substrate and a surface the second portion of the substrate.

Optionally, prior to removing the third adhesive portion of the first protective layer, the method further comprises forming a heat dissipating layer on a side of the first protective layer away from the substrate; wherein the heat dissipating layer at least partially covers the first portion of the substrate.

Optionally, the substrate is a mother substrate comprising a plurality of display substrate regions; and the method further comprises, subsequent to cutting the first protective layer of a respective one of the plurality of display substrates, cutting the mother substrate to obtain a plurality of display substrates.

Optionally, a ratio of the adhesive strength of the first adhesive portion to the adhesive strength of the third adhesive portion is in a range of 6 to 30; and a ratio of the adhesive strength of the second adhesive portion to the adhesive strength of the third adhesive portion is in a range of 6 to 30.

In another aspect, the present invention provides a display panel, comprising a display substrate comprising a first portion, a second portion, and a bendable portion connecting the first portion and the second portion; and a first protective layer comprising a first adhesive portion adhered to the first portion of the display substrate, and a second adhesive portion adhered to the second portion of the display substrate; wherein the display substrate bends about the bendable portion of the display substrate; the second adhesive portion and a part of the first adhesive portion are sandwiched between the second portion of the display substrate and a part of the first portion of the display substrate; the first adhesive portion, the second adhesive portion, and the display substrate defines a gap extending substantially along a first direction from a first lateral side of the display substrate to a second lateral side of the display substrate opposite to the first lateral side; and the first protective layer has an adhesive strength in a range of 500 gf/inch to 5000 gf/inch.

Optionally, the first protective layer has the adhesive strength in a range of 1000 gf/inch to 1500 gf/inch.

Optionally, the display substrate in the second portion comprises a bonding area on a side of the second adhesive portion away from the first adhesive portion; the display substrate in the first portion comprises a display area on a side of the first adhesive portion away from the second adhesive portion; the bonding area of the display substrate is configured to bond an integrate driving circuit and to transmit driving signals sent from the integrate driving circuit to the display area; and the display area of the display substrate is configured to display images using a plurality of light emitting elements.

Optionally, the display panel further comprises a second protective layer on a side of the display substrate away from the first protective layer; wherein the second protective layer substantially covers the first portion of the display substrate.

Optionally, the display panel further comprises a heat dissipating layer on a side of the first protective layer away from the display substrate; wherein the heat dissipating layer at least partially covers the first portion.

Optionally, a first width of the gap on an edge of the display substrate substantially along a second direction perpendicular to the first direction and on a plane having a side of the first adhesive portion away from the first portion of the display substrate is greater than a second width of a center part of the gap substantially along the second direction.

In another aspect, the present invention provides a display apparatus, comprising the display panel described herein; and one or more integrated circuits connected to the display panel.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Before bending the bendable portion of a display substrate, a portion of protective layer covers the bendable portion should be removed. However, it is discovered in the preset disclosure that conventional methods used to remove the portion of the protective layer include forming a protective layer on the display substrate and burning the portion of the protective layer using laser, or removing the portion of the protective layer prior to disposing the protective layer onto the display substrate. It is also discovered by the present disclosure that the conventional methods would lead to a complicated removing process, a low yield, etc.

Accordingly, the present disclosure provides, inter alia, a method of fabricating a display panel, a display panel, and a display apparatus that substantially obviate one or more of the problems due to limitations and disadvantages of the related art. In one aspect, the present disclosure provides a method of fabricating a display panel. In some embodiments, the method includes providing a substrate including a plurality of light emitting elements; forming a first protective layer on a side of the substrate; treating the first protective layer to obtain a first adhesive portion, a second adhesive portion, and a third adhesive portion, the third adhesive portion having an adhesive strength smaller than an adhesive strength of the first adhesive portion, and smaller than an adhesive strength of the second adhesive portion; and removing the third adhesive portion from the substrate to form a bendable portion of the substrate. Optionally, the bendable portion spaces apart a first portion of the substrate from a second portion of the substrate.

Figure 1A:
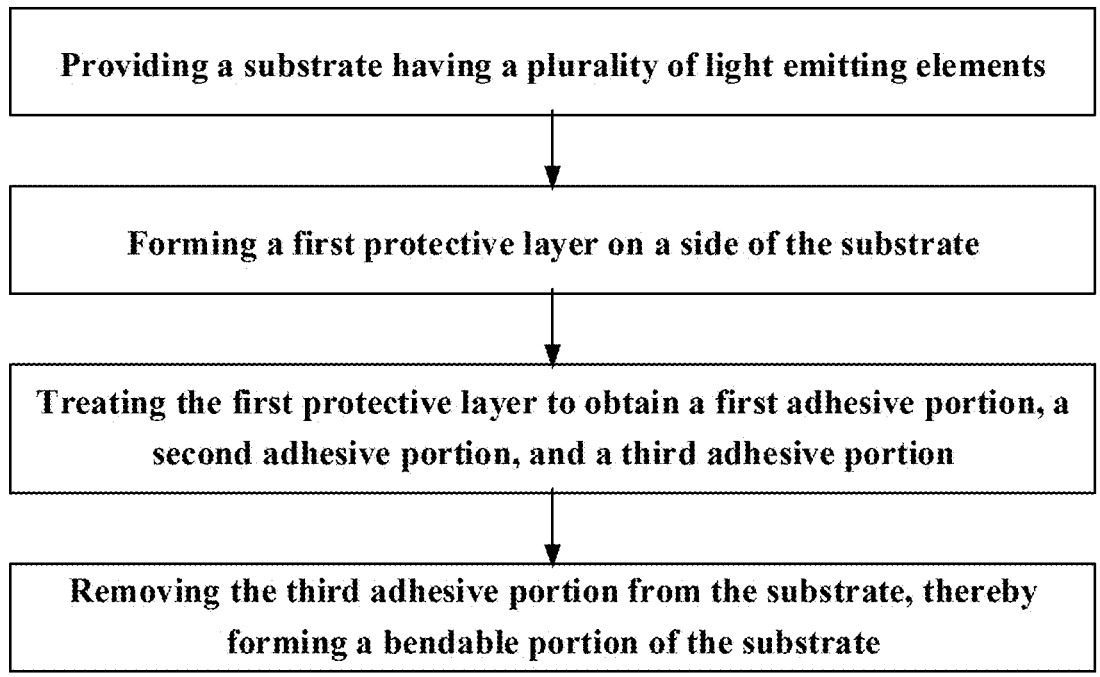
FIG. 1A is a flow chart illustrating a method of fabricating a display panel in some embodiments according to the present disclosure.

FIG. 1A is a flow chart illustrating a method of fabricating a display panel in some embodiments according to the present disclosure. Referring to FIG. 1A, in some embodiments, the method of fabricating the display panel includes providing a substrate having a plurality of light emitting elements; forming a first protective layer on a side of the substrate; treating the first protective layer to obtain a first adhesive portion, a second adhesive portion, and a third adhesive portion; removing the third adhesive portion from the substrate, thereby forming a bendable portion of the substrate. Optionally, the third adhesive portion has an adhesive strength smaller than an adhesive strength of the first adhesive portion, and smaller than an adhesive strength of the second adhesive portion.

Figure 1B:
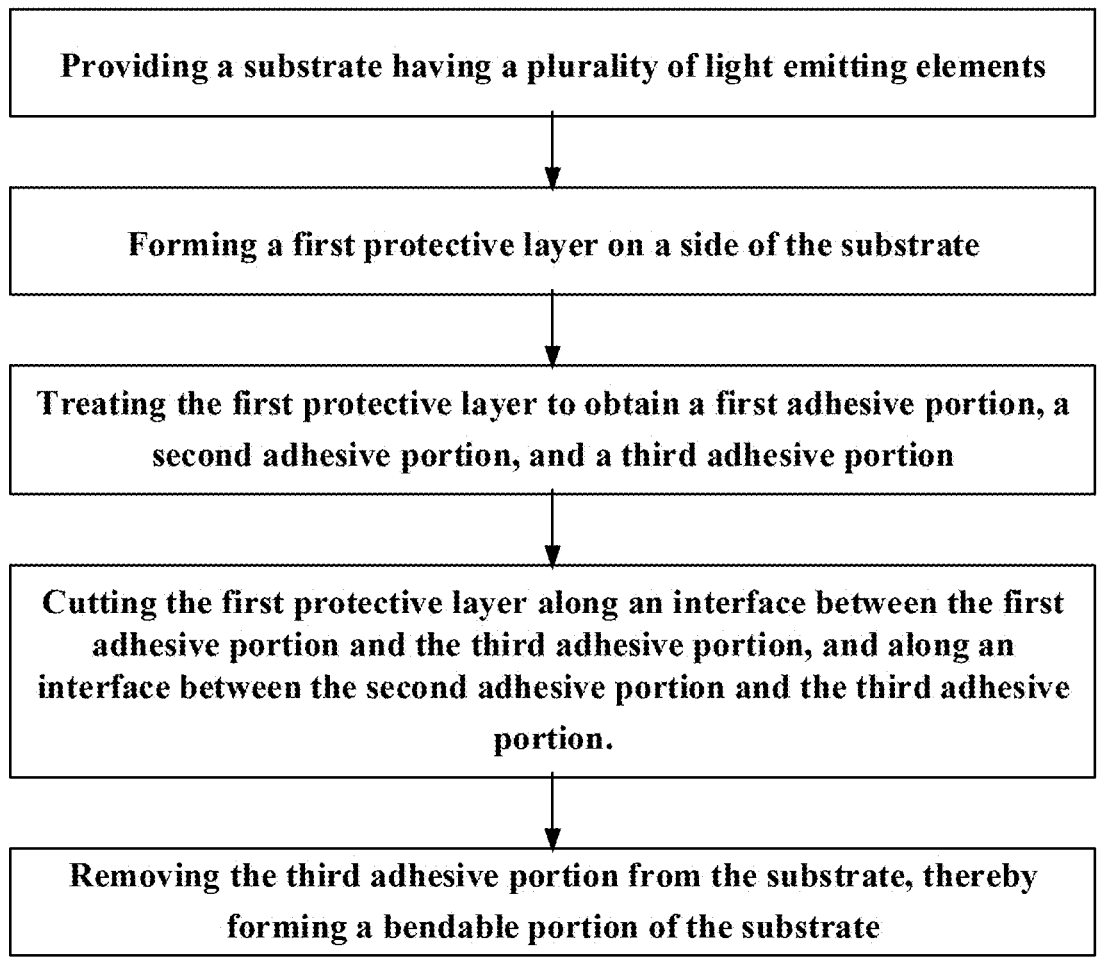
FIG. 1B is a flow chart illustrating a method of fabricating a display panel in some embodiments according to the present disclosure.

FIG. 1B is a flow chart illustrating a method of fabricating a display panel in some embodiments according to the present disclosure. Referring to FIG. 1B, in some embodiment, prior to removing the third adhesive portion, the method further includes cutting the first protective layer along an interface between the first adhesive portion and the third adhesive portion, and along an interface between the second adhesive portion and the third adhesive portion.

Figure 2A:
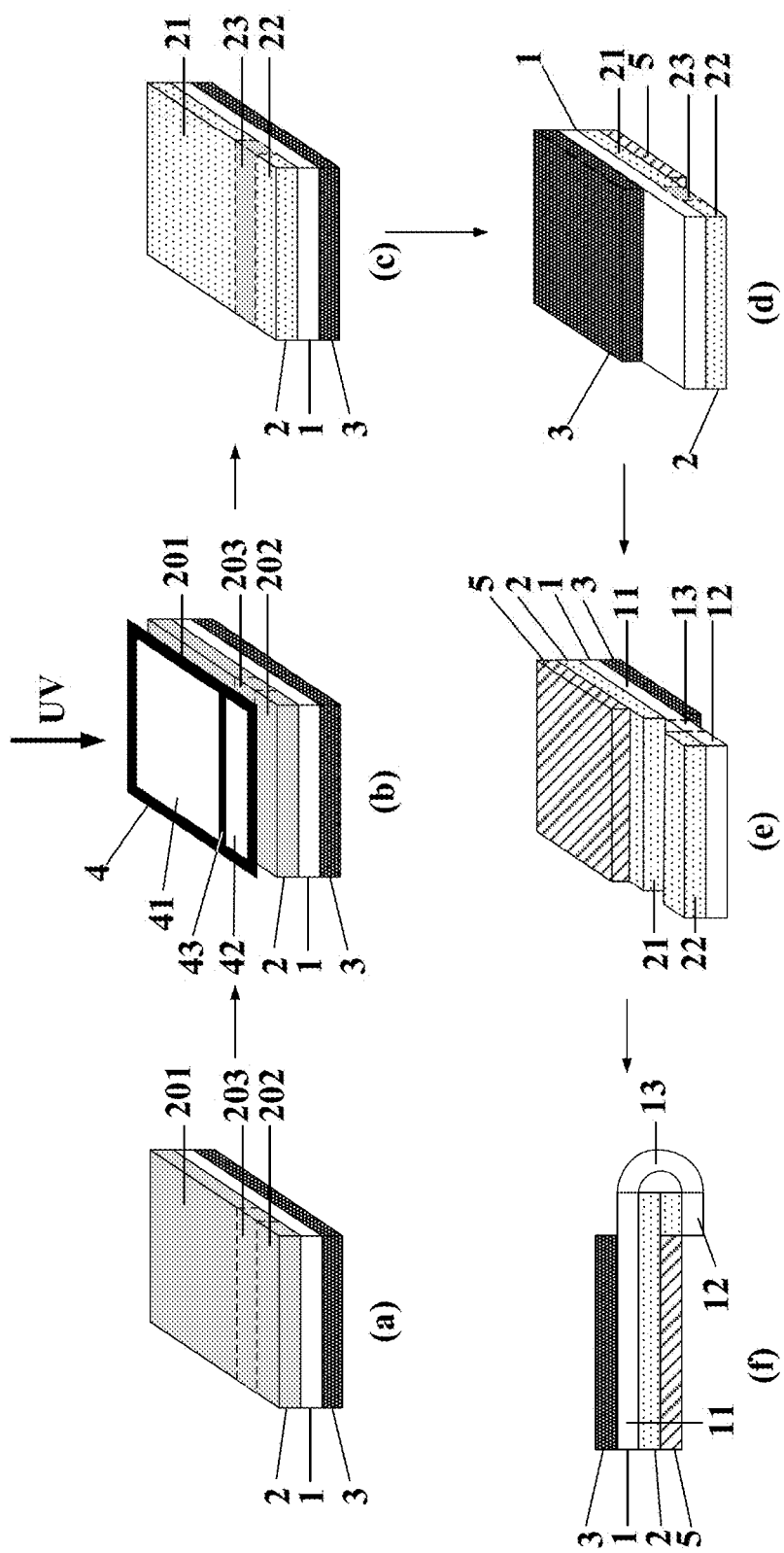
FIG. 2A is a schematic diagram illustrating a method of fabricating a display panel in some embodiment according to the present disclosure.
Figure 2B:
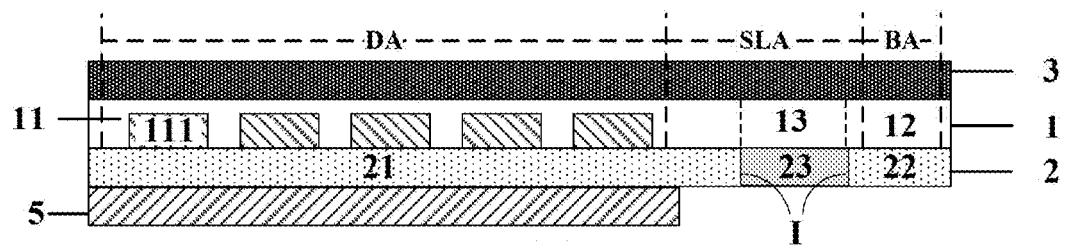
FIG. 2B is a schematic diagram of a structure of a display panel n some embodiments according to the present disclosure.

FIG. 2A is a schematic diagram illustrating a method of fabricating a display panel in some embodiment according to the present disclosure. FIG. 2B is a schematic diagram of a structure of a display panel in some embodiments according to the present disclosure.

Referring to FIG. 2A(a), and FIG. 2B, in some embodiments, the method of fabricating the display panel includes providing a substrate 1 having a plurality of light emitting elements 111; forming a first protective layer 2 on a side of the substrate 1. Optionally, the first protective layer 2 has an initial adhesive strength which is uniform throughout the entire first protective layer 2. Optionally, the first protective layer 2 substantially covers the substrate 1, for example, an orthographic projection of the first protective layer 2 on the substrate 1 substantially covers the substrate 1. Optionally, the substrate 1 is a flexible substrate.

As used herein, the term "adhesive strength" refers to a strength of an adhesive bond measured as a force required to separate two objects connected with each other through the adhesive bond. For example, the adhesive strength of the protective layer 2 is a strength of an adhesive bond between the protective layer 2 and the substrate 1, which is measured as a force required to separate the protective layer 2 and the substrate 1 with, each other through the adhesive bond. The adhesive strength is measured according to Japanese Industrial Standard (JIS) K 6833. Optionally, the unit for adhesive strength is gram-force per inch (gf/inch). One gf/inch equals to 0.001 kg×9.80665 meter per second$^2$.

As used herein, the term "substantially covers" refers to one layer being at least 50%, at least 60%, at least 70%, at least 80%, at least 90%, at least 95%, at least 99%, or 100% covered by another layer. Optionally, the substantially covers" refers to one orthographic projection being at least 50%, at least 60%, at least 70%, at least 80%, at least 90%, at least 95%, at least 99%, or 100% covered by another orthographic projection. For example, the substrate 1 is at least 50% covered by the first protective layer 2.

In some embodiments, referring to FIG. 2A(b), FIG. 2A(c), and FIG. 2B, the method of fabricating the display panel includes treating the first protective layer 2 to obtain a first adhesive portion 21, a second adhesive portion 22, and a third adhesive portion 23. Optionally, the third adhesive portion 23 has an adhesive strength smaller than an adhesive strength of the first adhesive portion 21, and smaller than an adhesive strength of the second adhesive portion 22.

In some embodiments, treating the first protective layer 2 includes exposing a first portion 201 of the first protective layer 2 with ultraviolet light (UV light), thereby forming the first adhesive portion 21; and exposing a second portion 202 of the first protective layer 2 with the ultraviolet light, thereby forming the second adhesive portion 22. And a third portion 203 of the first protective layer 2 is substantially unexposed by the ultraviolet light, thereby forming the third adhesive portion 23.

As used herein, the term "substantially unexposed" refers an area of a layer is not exposed or only minimally exposed to radiation. Optionally, "the third portion of the first protective layer is substantially unexposed by the ultraviolet light" means at least 50%, at least 60%, at least 70%, at least 80%, at least 90%, or 100% of ultraviolet light is blocked out from irradiating on the third portion of the first protective layer. Optionally, the amount of ultraviolet light irradiated on the first portion of the first protective layer is greater than the amount of ultraviolet light irradiated on the third portion of the first protective layer. Optionally, the amount of ultraviolet light irradiated on the second portion of the first protective layer is greater than the amount of ultraviolet light irradiated on the third portion of the first protective layer.

In some embodiments, treating the first protective layer 2 includes exposing the first protective layer 2 with the ultraviolet light using a mask plate 4 having a first light transmitting portion 41 corresponding to the first adhesive portion 21, a second light transmitting portion 42 corresponding to the second adhesive portion 22, and a light blocking portion 43 corresponding to the third adhesive portion 23.

Optionally, the mask plate 4 is aligned to the first protective layer 2. For example, aligning the mask plate 4 to the first protective layer 2 include align the first light transmitting portion 41 of the mask plate 4 to the first portion 201 of the first protective layer 2; aligning the second light transmitting portion 42 of the mask plate 4 to the second portion 202 of the first protective layer 2; and aligning the light blocking portion 43 of the mask plate 4 to the third portion 203 of the first protective layer 2.

Optionally, an orthographic projection of the first light transmitting portion 41 on the substrate 1 substantially overlaps with an orthographic projection of the first portion 201 of the first protective layer 2 on the substrate 1. Optionally, an orthographic projection of the second light transmitting portion 42 on the substrate 1 substantially overlaps with an orthographic projection of the second portion 202 of the first protective layer 2 on the substrate 1. Optionally, an orthographic projection of the light blocking portion 43 on the substrate 1 substantially overlaps with an orthographic projection of the third portion 203 of the first protective layer 2 on the substrate 1.

As used herein, the term "substantially overlap" refers to two orthographic projections at least 50%, e.g., at least 60%, at least 70%, at least 80%, at least 90%, at least 95%, at least 99%, overlapping with each other.

For example, the ultraviolet light irradiates on the first portion 201 of the first protective layer 2 through the first light transmitting portion 41 of the mask plate 4, the initial adhesive strength of the first portion 201 of the first protective layer 2 increases, so the first portion 201 of the first protective layer 2 becomes the first adhesive portion 21. The ultraviolet light irradiates on the second portion 202 of the first protective layer 2 through the second light transmitting portion 42 of the mask plate, the initial adhesive strength of the second portion 202 of the first protective layer 2 increases, so the second portion 202 of the first protective layer 2 becomes the second adhesive portion 22. The light blocking portion 43 prevents the ultraviolet light from irradiating on the third portion 203 of the first protective layer 2 to obtain the third adhesive portion 23 having the adhesive strength substantially the same as the initial adhesive strength of the third portion 203 of the first protective layer 2.

As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Aligning the mask plate 4 to the first protective layer 2 and exposing the first protective layer 2 can simplify the process of forming the first adhesive portion 21, the second adhesive portion 22, and the third adhesive portion 23, and accurately forming the first adhesive portion 21, the second adhesive portion 22, and the third adhesive portion 23 in specific positions. Also, the third adhesive portion 23 can also has the initial adhesive strength which is smaller than the adhesive strength of the first adhesive portion, and smaller than the adhesive strength of the second adhesive portion.

Figure 3A:
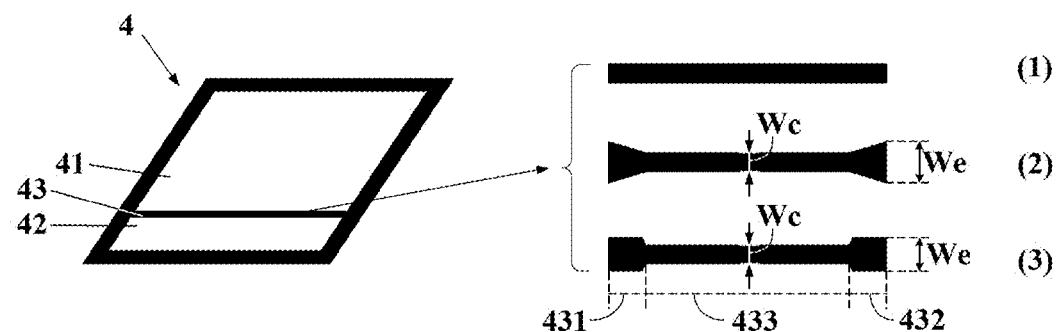
FIG. 3A is a schematic diagram of a structure of a mask plate in some embodiments according to the present disclosure.

In some embodiments, the light blocking portion 43 of the mask plate 4 may adopt various shape. FIG. 3A is a schematic diagram of a structure of a mask plate in some embodiments according to the present disclosure. Optionally, referring to FIG. 3A(1), the light blocking portion 43 has a rectangular shape.

Optionally, referring to FIG. 3A(2) and FIG. 3A(3), a width We of the light blocking portion 43 along an edge of the mask plate 4 substantially along a direction from the first light transmitting portion 41 of the mask plate 4 to the second light transmitting portion 42 of the mask plate 4 is greater than a width We of a center part of the light blocking portion 43 along the direction from the first light transmitting portion 41 of the mask plate 4 to the second light transmitting portion 42 of the mask plate 4.

For example, the light blocking portion 43 has a first part 431, a second part 432 and a third part 433 connecting the first part 431 and second part 432. Various appropriate shapes may be used to form the third part 433 of light blocking portion 43 including, but not limited to a rectangular shape, a trapezoidal shape, squared shape, an elliptic shape, or other polygonal shapes. Various appropriate shapes may be used to form the first part 431 of light blocking portion 43 and the second part 432 of the light blocking portion 43 including, but not limited to a rectangular shape, a trapezoidal shape, squared shape, a triangular shape or other polygonal shapes. The first part 431 of the light blocking portion 43 and the second part 432 of the light blocking portion 43 have different shapes.

Figure 3B:
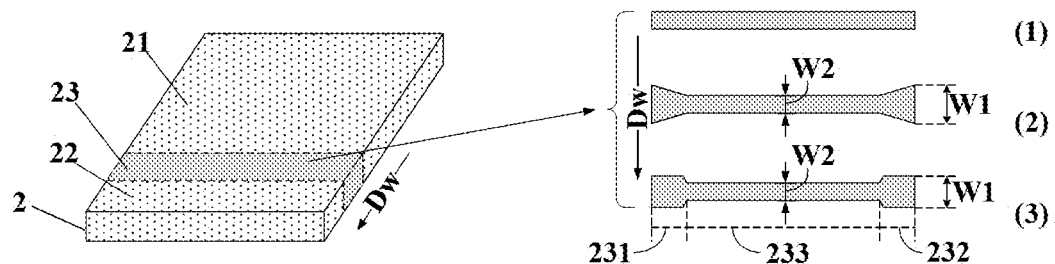
FIG. 3B is a schematic diagram of a structure of a first protective layer in some embodiments according to the present disclosure.

FIG. 3B is a schematic diagram of a structure of a first protective layer in some embodiments according to the present disclosure. In some embodiments, referring to FIG. 3B, the third adhesive portion 23 formed by exposing the first protective layer 2 has a shape corresponding to the shape of the light blocking portion 43 of the mask plate 4. Optionally, referring to FIG. 3B(2) and FIG. 3B(3), a first width W1 of the third adhesive portion 23 on an edge of the substrate 1 substantially along a width direction Dw from the first adhesive portion 21 to the second adhesive portion 22 is greater than a second width W2 of a center part of the third adhesive portion substantially along, the width direction Dw.

For example, the third adhesive portion 23 has a first part 231, a second part 232 and a third part 233 connecting the first part 231 and second part 232. Various appropriate shapes may be used to form the third part 233 of the third adhesive portion 23 including, but not limited to a rectangular shape, a trapezoidal shape, squared shape, an elliptic shape, or other polygonal shapes. Various appropriate shapes may be used to form the first part 231 of the third adhesive portion 23 and the second part 232 of the third adhesive portion 23 including, but not limited to a rectangular shape, a trapezoidal shape, squared shape, a triangular shape or other polygonal shapes. The first part 231 of the third adhesive portion 23 and the second part 232 of the third adhesive portion 23 have different shapes.

Referring to FIG. 2A, FIG. 3A and FIG. 3B, by aligning the mask plate 4 to the first protective layer 2, the third adhesive portion 23 of the first protective layer 2 formed using the mask plate 4 has a shape substantially the same as the shape of the light blocking portion 43 of the mask plate 4.

In some embodiments, referring to FIG. 2A(c) to FIG. 2A(e) and FIG. 2B, subsequent to treating the first protective layer 2, the method of fabricating the display panel further includes removing the third adhesive portion 23 from the substrate 1 to form a bendable portion 13 of the substrate 1. Optionally, the bendable portion 13 of the substrate 1 spaces apart a first portion 11 of the substrate 1 from a second portion 12 of the substrate 1.

Optionally, the third adhesive portion 23 has the first width W1 greater than a second width W2, which allows the third adhesive portion 23 to be easily removed from the substrate 1, and avoids the third adhesive portion 23 to be torn apart resulting to fail to remove the entire third adhesive portion 23 during the removing process.

In some embodiments, subsequent to exposing the first protective layer 2 with the ultraviolet light, the first adhesive portion 21, the second adhesive portion 22, and the third adhesive portion 23 of the first protective layer 2 are obtained.

Optionally, the adhesive strength of the third adhesive portion 23 of the first protective layer 2 is in a range of 50 gf/inch to 150 gf/inch, e.g., 50 gf/inch to 70 gf/inch, 70 gf/inch to 90 gf/inch, 90 gf/inch to 110 gf/inch, 110 gf/inch to 130 gf/inch, and 130 gf/inch to 150 gf/inch.

Optionally, the adhesive strengths of the first adhesive portion 21 and the second adhesive portion 22 are in a range of 1000 gf/inch to 1500 gf/inch, e.g., 1000 gf/inch to 1100 gf/inch, 1100 gf/inch to 1200 gf/inch, 1200 gf/inch to 1300 gf/inch, 1300 gf/inch to 1400 gf/inch, and 1400 gf/inch to 1500 gf/inch.

Optionally, a ratio of the adhesive strength of the first adhesive portion 21 to the adhesive strength of the third adhesive portion 23 is in a range of 6 to 30, e.g., 6 to 10, 10 to 15, 15 to 20, 20 to 25, and 25 to 30. Optionally, a ratio of the adhesive strength of the second adhesive portion 22 to the adhesive strength of the third adhesive portion 23 is in a range of 6 to 30, e.g., 6 to 10, 10 to 15, 15 to 20, 20 to 25, and 25 to 30.

Optionally, in the first protective layer 2, the adhesive strength of the third adhesive portion 23 is greater than zero, which allows the third adhesive portion 23 to adhere to the substrate 1. Optionally, the adhesive strengths of the first adhesive portion 21 and the second adhesive portion 22 are greater than the adhesive strength of the third adhesive portion 23. During the process of removing the third adhesive portion 23, because the first adhesive portion 21 and the second adhesive portion 22 have greater adhesive strengths, it is more difficult to remove the first adhesive portion 21 and the second adhesive portion 22 from the substrate 1 than to remove the third adhesive portion 23, so subsequent to removing the third adhesive portion 23, the first adhesive portion 21 and the second adhesive portion 22 still adhere to the substrate 1.

In some embodiments, the first protective layer 2 includes a matrix material and an initiator. Optionally, the matrix material is selected from a group consisting of acrylic, epoxy, and polyurethane. Optionally, the initiator is selected from a group consisting of azobisisobutyronitrile, benzophenone, fluorescein, and eosin.

Optionally, during the process of exposing the first protective layer 2, under the irradiation of the ultraviolet light, cross linking reactions happen between the matrix material and the initiator, which can better improve the adhesive strengths of the first adhesive portion 21 and the second adhesive portion 22 of the first protective layer 2.

In some embodiments, referring to FIG. 2A and FIG. 2B, prior to removing the third adhesive portion 23, the method of fabricating the display panel further includes cutting the first protective layer along an interface I between the first adhesive portion 21 and the third adhesive portion 23, and along an interface I between the second adhesive portion 22 and the third adhesive portion 23.

In some embodiments, referring to FIG. 2B, the first portion 11 of the substrate 1 includes a display area DA of the substrate 1. Optionally, the second portion 12 of the substrate 1 includes a bonding area BA configured to bond an integrate driving circuit and to transmit driving signals sent from the integrate driving circuit to the display area DA. Optionally, the display area DA of the substrate 1 configured to display images using the plurality of light emitting elements 111.

As used herein, the term "display area" refers to an area of the substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

In some embodiments, the substrate 1 includes a signal line area SLA having a plurality of signal lines. Optionally, the signal line area SLA extends from the first portion 11 of the substrate throughout the bendable portion 13 of the substrate 1 to the second portion 12 of the substrate 1. Optionally, the signal line area SLA connects the display area DA of the substrate 1 and the bonding area BA of the substrate 1.

Optionally, first ends of the plurality of signals extend through the bonding area BA. Optionally, second ends of the plurality of signals extend to the display area DA to electrically connect to the plurality of light emitting elements 111 in the display area DA. For example, the plurality of signal lines in the signal line area SLA are configured to transmit signals sent from the integrate driving circuit to the display area DA.

In some embodiments, referring to FIG. 2A(f), subsequent to remove the third adhesive portion 23 of the first protective layer 2, the method of fabricating the display panel further includes bending the bendable portion 13 of the substrate 1 to allow the second adhesive portion 22 and a part of the first adhesive portion 21 sandwiched between the second portion 12 of the substrate 1 and a part of the first portion 11 of the substrate 1. Optionally, the second adhesive portion 22 adheres to the part of the first adhesive portion 21.

Optionally, an orthographic projection of the second portion 12 of the substrate 1 on the second protective layer 3 and an orthographic projection of the second adhesive portion 22 of the first protective layer 2 on the second protective layer 3 at least partially overlap with an orthographic projection of first adhesive portion 21 of the first protective layer 2 on the second protective layer 3 and an orthographic projection of first portion 11 of the substrate 1 on the second protective layer 3.

By bending the substrate 1, the bonding area BA of the substrate 1 is disposed on a side of the display area DA closer to the first protective layer 2, which may narrow the frame of the display panel.

In some embodiments, referring to FIG. 2A, prior to treating the first protective layer 2, the method of fabricating the display panel further includes forming a second protective layer 3 on a side of the substrate 1 away from the first protective layer 2.

In some embodiments, subsequent to cutting the first protective layer 2 and prior to removing the third adhesive portion 23 of the first protective layer 2, the method of fabricating the display substrate further includes removing a portion of the second protective layer 3 to expose a surface of the bendable portion 13 of the substrate 1 and a surface the second portion 12 of the substrate 1.

For example, the second protective layer 3 is formed to substantially cover the substrate 1, including covering the bendable portion 13 of the substrate 1 and second portion 12 of the substrate 1. A portion of the second protective layer 3 substantially covering the bendable portion 13 of the substrate 1 and second portion 12 of the substrate 1 should be removed to allow the bendable portion 13 of the substrate 1 to be bent, and to allow the bonding area BA of the second portion 12 of the substrate to connect to the integrate driving circuit.

Various appropriate methods may be used to remove the portion of the second protective layer 3. For example, referring to FIG. 2A(c) to FIG. 2A (d), subsequent to cutting the first protective layer 2, removing the portion of the second protective layer 3 includes flipping the substrate 1 around; cutting an interface between the portion of second protective layer 3 which covers the bendable portion 13 of the substrate 1 and the second portion 12 of the substrate 1, and the remaining portion of the second protective layer 3; and removing the portion of second protective layer 3 covering the bendable portion 13 of the substrate 1 and second portion 12 of the substrate 1. Optionally, a same cutting process is used to cut the first protective layer 2 and the second protective layer 3. Using the same cutting process to cut the first protective layer 2 and the second protective layer 3 may simplify the process of fabricating the display panel. For example, the cutting process includes cutting the first protective layer 2 along an interface between the first adhesive portion 21 and the third adhesive portion 23, and along an interface between the second adhesive portion 22 and the third adhesive portion 23; and cutting the second protective layer 3 along an interface between the portion of second protective layer 3 which covers the bendable portion 13 of the substrate 1 and the second portion 12 of the substrate 1, and the remaining portion of the second protective layer 3. Various appropriate methods may be used to cut both the first protective layer and the second protective layer. Examples of methods appropriate for cutting the first protective layer and the second protective layer include, but are not limited to, a laser cutting, an air-jet cutting, and a hot water-jet cutting.

Optionally, after removing the portion of the second protective layer 3, the remaining portion of the second protective layer 3 substantially covers the plurality of light emitting elements 111 in the substrate 1, which may prevent the plurality of light emitting elements from being contaminated or damaged during transportation.

Optionally, the second protective layer 3 provides temporary protection on the substrate 1. Optionally, prior to forming layers including, but not limited to, polarizer and enhancer, the second protective layer 3 should be removed.

In some embodiments, referring to FIG. 2A and FIG. 2B, prior to removing the third adhesive portion 23 of the first protective layer 2, the method of fabricating the display panel further includes forming a heat dissipating layer 5 on a side of the first protective layer 2 away from the substrate 1. Optionally, the heat dissipating layer 5 is at least partially covers the first portion of the substrate 1. In one example, an orthographic projection of the heat dissipating layer 5 on the first protective layer 2 is at, least partially overlapping with an orthographic projection of the first portion 11 of the substrate 1 on the first protective layer 2. In another example, an orthographic projection of the heat dissipating layer 5 on the first protective layer 2 is at least partially overlapping with an orthographic projection of the display area DA of the substrate 1. The heat dissipating layer 5 is configured to expedite a process of dissipating heat produced by the display substrate 1, which can extend the life of the display panel.

In some embodiments, the substrate is a mother substrate including a plurality of display substrate regions. Optionally, the method of fabricating the display panel further includes, subsequent to cutting the first protective layer of a respective one of the plurality of display substrates, cutting the mother substrate to obtain a plurality of display substrates.

Figure 4A:
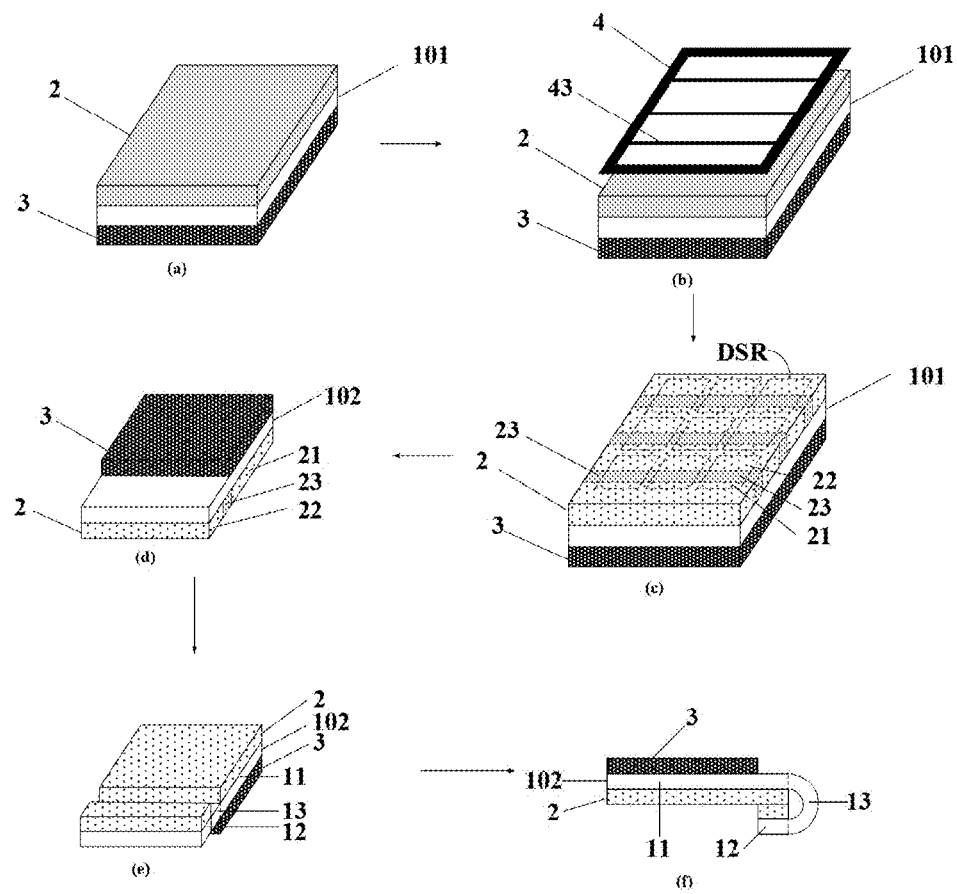
FIG. 4A is a schematic diagram illustrating a method of fabricating a plurality of display panels using a mother substrate in some embodiments according to the present disclosure.
Figure 4B:
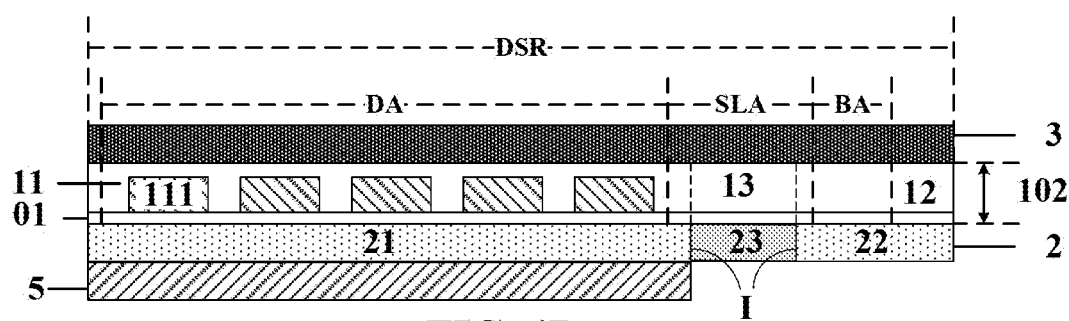
FIG. 4B is a schematic diagram of a structure of a respective one of the plurality of display panels in some embodiments according to the present disclosure.

FIG. 4A is a schematic diagram illustrating a method of fabricating a plurality of display panels using a mother substrate in some embodiments according to the present disclosure. FIG. 4B is a schematic diagram of a structure of a respective one of the plurality of display panels in some embodiments according to the present disclosure. Referring to FIG. 4A and FIG. 4B, in some embodiments, the method of fabricating a plurality of display panels includes forming a mother substrate 101 having a plurality of display substrate regions DSR. Optionally, the plurality of light emitting elements 111 are in a respective one of the plurality of display substrate regions DSR. Optionally, the mother substrate 101 is a flexible substrate. Optionally, the mother substrate 101 has a base substrate 01. The plurality of light emitting elements 111 is disposed on the base substrate 01.

In some embodiments, the method of fabricating the plurality of display panels includes forming the first protective layer 2 on a side of the base substrate 01 away from the plurality of light emitting elements 111; forming a second protective layer 3 on a side of the mother substrate 101 away from the first protective layer 2; exposing the first protective layer 2 with the ultraviolet light using a mask plate 4 to forming a first adhesive portion 21, a second adhesive portion 22 and the third adhesive portion 23 connecting the first adhesive portion 21 and the second adhesive portion 22 in the respective one of the plurality of display substrate regions DSR; cutting the mother substrate 101 to obtain a plurality of display substrates 102; and removing the third adhesive portion 23 from the respective one of the plurality of the display substrates 102, thereby forming a bendable portion 13 of the respective one of the plurality of display substrates 102. Optionally, the bendable portion 13 of the respective one of the plurality of display substrates 102 spaces apart a first portion 11 of the respective one of the plurality of display substrates 102 from a second portion 12 of the respective one of the plurality of display substrates 102.

Optionally, the adhesive strength of the third adhesive portion 23 is smaller than the adhesive strength of the first adhesive portion 21, and smaller than the adhesive strength of the second adhesive portion 22.

Optionally, the first portion 11 of the respective one of the plurality of display substrates 102 includes a display area DA. Optionally, the second portion 12 of the respective one of the plurality of display substrates 102 includes a bonding area BA configured to bond an integrate driving circuit and to transmit driving signals sent from the integrate driving circuit to the display area DA.

In some embodiments, subsequent to exposing the first protective layer 2, the method of fabricating the plurality of display panels further includes performing a first cutting on first protective layer 2 along an interface between the first adhesive portion 21 and the third adhesive portion 23, and along an interface between the second adhesive portion 22 and the third adhesive portion 23 in the respective one of the plurality of display substrate regions DSR; performing a second cutting on the mother substrate 101 along borders of the plurality of display substrate regions DSR to obtain the plurality of display substrate 102. Optionally, the first protective layer 2 and the second protective layer 3 are also cut along borders of the plurality of display substrate regions DSR.

In some embodiments, subsequent to performing the second cutting, the method of fabricating the plurality of display panels further includes performing a third cutting on second protective layer 3 on the respective one of the plurality of display substrates to remove a portion of the second protective layer 3 to expose a surface of the bendable portion 13 of the respective one of the plurality of display substrates 102 and a surface of the second portion 12 of the respective one of the plurality of display substrates 102. Optionally, the third cutting is performed along an interface between the portion of second protective layer 3 which covers the bendable portion 13 of the substrate 1 and the second portion 12 of the substrate 1, and the remaining portion of the second protective layer 3.

In some embodiments, subsequent to remove the portion of the second protective layer 3, the method of fabricating the plurality of display panels further includes bonding an integrate driving circuit to the bonding area DA of the second portion 12 of the respective one of the plurality of display substrates 102.

In some embodiments, subsequent to removing the third adhesive portion 23 from the respective one of the plurality of the display substrates 102, the method of fabricating the plurality of display panels further includes bending the bendable portion 13 of the respective one of the plurality of the display substrates 102 to allow the second adhesive portion 22 and a part of the first adhesive portion 21 sandwiched between the second portion 12 of the respective one of the plurality of the display substrates 102 and a part of the first portion 11 of the respective one of the plurality of the display substrates 102.

Optionally, an orthographic projection of the second portion 12 of the display substrate 102 on the second protective layer 3 and an orthographic projection of the second adhesive portion 22 of the first protective layer 2 on the second protective layer 3 at least partially overlap with an orthographic projection of first adhesive portion 21 of the first protective layer 2 on the second protective layer 3 and an orthographic projection of first portion 11 of the display substrate 102 on the second protective layer 3.

In some embodiments, treating the plurality of display substrate regions DSR in the mother substrate 101 can greatly increase an efficiency of fabricating the plurality of display substrates 102.

Figure 5A:
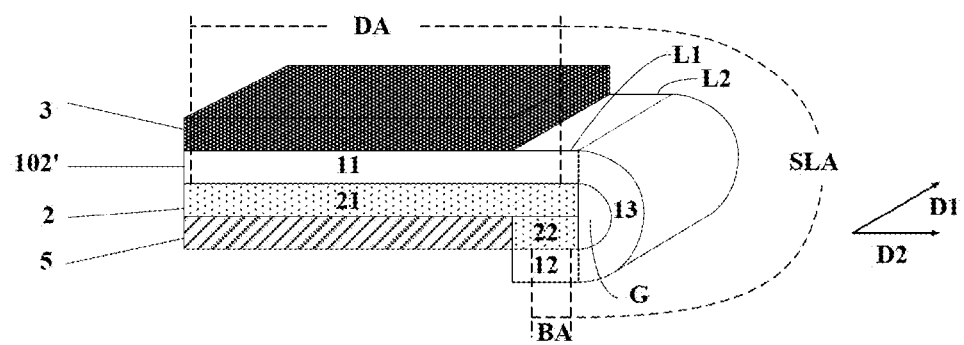
FIG. 5A is a schematic diagram of a structure of a display panel in some embodiments according to the present disclosure.

In another aspect, the present disclosure also provides a display panel fabricated by the method described herein. FIG. 5A is a schematic diagram of a structure of a display panel in some embodiments according to the present disclosure. In some embodiments, referring to FIG. 5A, a display panel includes a display substrate 102' having a first portion 11, a second portion 12, and a bendable portion 13 connecting the first portion 11 and the second portion 12; and a first protective layer 2 having a first adhesive portion 21 adhered to the first portion 11 of the display substrate 102', and a second adhesive portion 22 adhered to the second portion 12 of the display substrate 102'.

Optionally, the display substrate 102' bends about the bendable portion 13 of the display substrate 102'. Optionally, the second adhesive portion 22 and a part of the first adhesive portion 21 are sandwiched between the second portion 12 of the display substrate 102' and a part of the first portion 11 of the display substrate 102'.

Optionally, an orthographic projection of the second portion 12 of the display substrate 102' on the second protective layer 3 and an orthographic projection of the second adhesive portion 22 of the first protective layer 2 on the second protective layer 3 at least partially overlap with an orthographic projection of first adhesive portion 21 of the first protective layer 2 on the second protective layer 3 and an orthographic projection of first portion 11 of the display substrate 102' on the second protective layer Optionally, the first adhesive portion 21, the second adhesive portion 22, and the display substrate 102' defines a gap G extending substantially along a first direction D1 from a first lateral side L1 of the display substrate 102' to a second lateral side L2 of the display substrate 102' opposite to the first lateral side L1. Optionally the first protective layer 2 has an adhesive strength to adhere the first adhesive portion 21 to the first portion 11 of the display substrate 102' and adhere the second adhesive portion 22 to the second portion 12 of the display substrate 102'.

Optionally, the adhesive strength of the first protective layer 2 is in a range of 500 gf/inch to 5000 gf/inch, e.g., 500 gf/inch to 1000 gf/inch, 1000 gf/inch, to 1500 gf/inch, 1500 gf/inch to 2000 gf/inch, 2000 gf/inch to 2500 gf/inch, 2500 gf/inch to 3000 gf/inch, 3000 gf/inch to 3500 gf/inch, 3500 gf/inch to 4000 gf/inch, 4000 gf/inch to 4500 gf/inch, and 4500 gf/inch to 5000 gf/inch.

Optionally, the adhesive strength of the first protective layer 2 is in a range of 1000 gf/inch to 1500 gf/inch, e.g., 1000 gf/inch to 1100 gf/inch, 1100 gf/inch to 1200 gf/inch, 1200 gf/inch to 1300 gf/inch, 1300 gf/inch to 1400 gf/inch, and 1400 gf/inch to 1500 gf/inch.

In some embodiments, the display substrate 102' in the second portion 12 includes a bonding area BA on a side of the second adhesive portion 22 away from the first adhesive portion 21. Optionally, the display substrate 102' in the first portion 11 includes a display area DA on a side of the first adhesive portion 21 away from the second adhesive portion 22. Optionally, the bonding area BA of the display substrate 102 is configured to bond an integrate driving circuit and to transmit driving signals sent from the integrate driving circuit to the display area DA. Optionally, the display area DA of the display substrate 102 is configured to display images using a plurality of light emitting elements 111.

Optionally, the display substrate 102' includes a signal line area SLA having a plurality of signal lines. Optionally, the signal line area SLA extends from the first portion 11 of the display substrate 102', throughout the bendable portion 13 of the display substrate 102' to the second portion 12 of the display substrate 102'. Optionally, the signal line area SLA connects the display area DA of the display substrate 102' and the bonding area BA of the display substrate 102'.

Optionally, first ends of the plurality of signals extend through the bonding area BA. Optionally, second ends of the plurality of signals extend to the display area DA to electrically connect to the plurality of light emitting elements 111 in the display area DA. For example, the plurality of signal lines in the signal line area SLA are configured to transmit signals sent from the integrate driving circuit to the display area DA. By bending the bendable portion 13 of the display substrate 102', the bonding area BA of the display substrate 102' is disposed on a side of the display area DA of the display substrate 102' to make a narrow frame of the display panel.

In some embodiments, the display panel further includes a second protective layer 3 on a side of the display substrate 102' away from the first protective layer 2. Optionally, the second protective layer 3 substantially covers the first portion 11 of the display substrate 102'. Optionally, the second protective layer 3 substantially covers the display area DA of the display substrate 102'. Optionally, an orthographic projection of the second protective layer 3 on the display substrate 102' substantially covers the covers the first portion 11 of the display substrate 102'. Optionally, an orthographic projection of the second protective layer 3 on the display substrate 102' substantially covers the covers the display area DA of the display substrate 102'. For example, the second protective layer 3 may prevent the plurality of light emitting elements 111 in the display area DA of the display substrate 102' from being contaminated or damaged during transportation.

In some embodiments, the display panel further includes a heat dissipating layer 5 on a side of the first protective layer 2 away from the display substrate 102'. Optionally, the heat dissipating layer 5 at least partially covers the first portion 11 of the display substrate 102'. Optionally, an orthographic projection of the heat dissipating layer 5 on the display substrate 102' at least partially overlapping with the first portion 11 of the display substrate 102'. Optionally, an orthographic projection of the heating dissipating layer 5 on the display substrate 102' at least partially overlapping with the display area DA of the display substrate 102'. For example, the heat dissipating layer 5 is configured to expedite a process of dissipating heat produced by the display substrate 1, which can extend the life of the display panel.

Figure 5B:
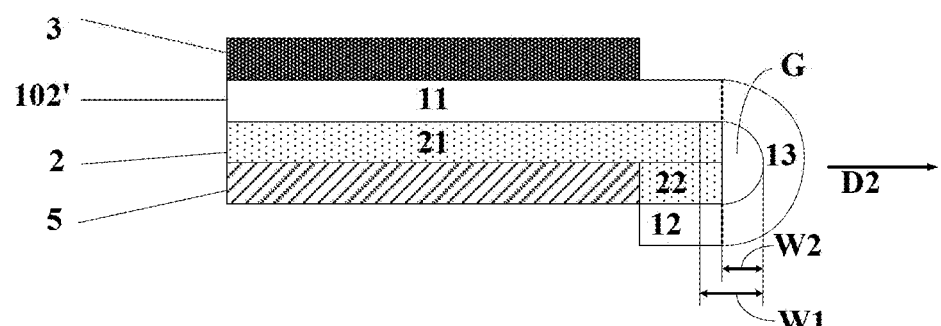
FIG. 5B is a schematic diagram of a structure of a display panel some embodiments according to the present disclosure.

FIG. 5B is a schematic diagram of a structure of a display panel in some embodiments according to the present disclosure. In some embodiments, the FIG. 5B is a front view of the display panel formed using the mask plate in FIG. 3A(2) or FIG. 3A(3).

Optionally, a first width W1 of the gap G on an edge (e.g., L1) of the display substrate 102' substantially along a second direction D2 perpendicular to the first direction D1 and on a plane having a side of the first adhesive portion 21 away from the first portion 11 of display substrate 102' is greater than a second width W2 of a center part of the gap G substantially along the second direction D2.

In another aspect, the present disclosure also provide a display apparatus. In some embodiments, the display apparatus includes a display panel described herein or fabricated be the method described herein; and one or more integrated circuits connected to the display panel. The method described herein used to fabricate the display panel can lower the cost of fabricating the display panel and improve the production yield.

The foregoing description of the embodiments of the invention has been presented for purposes of illustration and description. It is not intended to be exhaustive or to limit, the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a display panel, comprising:
providing a substrate comprising a plurality of light emitting elements;
forming a first protective layer on a side of the substrate;
treating the first protective layer to obtain a first adhesive portion, a second adhesive portion, and a third adhesive portion, the third adhesive portion having an adhesive strength smaller than an adhesive strength of the first adhesive portion, and smaller than an adhesive strength of the second adhesive portion; and
removing the third adhesive portion from the substrate, thereby forming a bendable portion of the substrate;
wherein the bendable portion of the substrate spaces apart a first portion of the substrate from a second portion of the substrate.

2. The method of claim 1, wherein treating the first protective layer comprises exposing a first portion of the first protective layer with ultraviolet light, thereby forming the first adhesive portion; and
exposing a second portion of the first protective layer with the ultraviolet light, thereby forming the second adhesive portion;
wherein a third portion of the first protective layer is substantially unexposed by the ultraviolet light, thereby forming the third adhesive portion.

3. The method of claim 2, wherein treating the first protective layer comprises exposing the first protective layer with the ultraviolet light using a mask plate having a first light transmitting portion corresponding to the first adhesive portion, a second light transmitting portion corresponding to the second adhesive portion, and a light blocking portion corresponding to the third adhesive portion.

4. The method of claim 1, wherein a first width of the third adhesive portion on an edge of the substrate substantially along a width direction from the first adhesive portion to the second adhesive portion is greater than a second width of a center part of the third adhesive portion substantially along the width direction.

5. The method of claim 1, wherein the adhesive strength of the third adhesive portion of the first protective layer is in a range of 50 gf/inch to 150 gf/inch; and adhesive strengths of the first adhesive portion and the second adhesive portion are in a range of 1000 gf/inch to 1500 gf/inch.

6. The method of claim 1, wherein the first protective layer comprises a matrix material and an initiator.

7. The method of claim 6, wherein the matrix material is selected from a group consisting of acrylic, epoxy, and polyurethane; and
the initiator is selected from a group consisting of azobisisobutyronitrile, benzophenone, fluorescein, and eosin.

8. The method of claim 1, prior to removing the third adhesive portion, further comprising cutting the first protective layer along an interface between the first adhesive portion and the third adhesive portion, and along an interface between the second adhesive portion and the third adhesive portion.

9. The method of claim 1, wherein the first portion of the substrate comprises a display area configured to display images using the plurality of light emitting elements;
the second portion of the substrate comprises a bonding area configured to bond an integrate driving circuit and to transmit driving signals sent from the integrate driving circuit to the display area; and
wherein subsequent to remove the third adhesive portion of the first protective layer, the method further comprises bending the bendable portion of the substrate to allow the second adhesive portion and a part of the first adhesive portion sandwiched between the second portion of the substrate and a part of the first portion of the substrate.

10. The method of claim 8, prior to treating the first protective layer, further comprising forming a second protective layer on a side of the substrate away from the first protective layer;
subsequent to cutting the first protective layer and prior to removing the third adhesive portion of the first protective layer, further comprising removing a portion of the second protective layer to expose a surface of the bendable portion of the substrate and a surface the second portion of the substrate.

11. The method of claim 1, prior to removing the third adhesive portion of the first protective layer, further comprising forming a heat dissipating layer on a side of the first protective layer away from the substrate;
wherein the heat dissipating layer at least partially covers the first portion of the substrate.

12. The method of claim 1, wherein the substrate is a mother substrate comprising a plurality of display substrate regions; and the method further comprises, subsequent to cutting the first protective layer of a respective one of the plurality of display substrates, cutting the mother substrate to obtain a plurality of display substrates.

13. The method of claim 1, wherein a ratio of the adhesive strength of the first adhesive portion to the adhesive strength of the third adhesive portion is in a range of 6 to 30; and a ratio of the adhesive strength of the second adhesive portion to the adhesive strength of the third adhesive portion is in a range of 6 to 30.

14. A display panel, comprising:

a display substrate comprising a first portion, a second portion, and a bendable portion connecting the first portion and the second portion; and a first protective layer comprising a first adhesive portion adhered to the first portion of the display substrate, and a second adhesive portion adhered to the second portion of the display substrate;

wherein the display substrate bends about the bendable portion of the display substrate;

the second adhesive portion and a part of the first adhesive portion are sandwiched between the second portion of the display substrate and a part of the first portion of the display substrate;

the first adhesive portion, the second adhesive portion, and the display substrate defines a gap extending substantially along a first direction from a first lateral side of the display substrate to a second lateral side of the display substrate opposite to the first lateral side; and the first protective layer has an adhesive strength in a range of 500 gf/inch to 5000 gf/inch.

15. The display panel of claim 14, wherein the first protective layer has the adhesive strength in a range of 1000 gf/inch to 1500 gf/inch.

16. The display panel of claim 14, wherein the display substrate in the second portion comprises a bonding area on a side of the second adhesive portion away from the first adhesive portion;

the display substrate in the first portion comprises a display area on a side of the first adhesive portion away from the second adhesive portion;

the bonding area of the display substrate is configured to bond an integrate driving circuit and to transmit driving signals sent from the integrate driving circuit to the display area; and the display area of the display substrate is configured to display images using a plurality of light emitting elements.

17. The display panel of claim 14, further comprising a second protective layer on a side of the display substrate away from the first protective layer; wherein the second protective layer substantially covers the first portion of the display substrate.

18. The display panel of claim 14, further comprising a heat dissipating layer on a side of the first protective layer away from the display substrate; wherein the heat dissipating layer at least partially covers the first portion.

19. The display panel of claim 14, wherein a first width of the gap on an edge of the display substrate substantially along a second direction perpendicular to the first direction and on a plane having a side of the first adhesive portion away from the first portion of the display substrate is greater than a second width of a center part of the gap substantially along the second direction.

20. A display apparatus, comprising:

the display panel of claim 14; and one or more integrated circuits connected to the display panel.

* * * * *